United States Patent
Nistler

(10) Patent No.: US 10,718,843 B2
(45) Date of Patent: Jul. 21, 2020

(54) DEVICE AND METHOD FOR DETECTING SPIKES DURING A MAGNETIC RESONANCE SCAN

(71) Applicant: Siemens Healthcare GmbH, Erlangen (DE)

(72) Inventor: Jürgen Nistler, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/293,118

(22) Filed: Mar. 5, 2019

(65) Prior Publication Data

US 2019/0277933 A1 Sep. 12, 2019

(30) Foreign Application Priority Data

Mar. 7, 2018 (EP) ..................................... 18160421

(51) Int. Cl.
*G01R 33/565* (2006.01)
*G01R 33/341* (2006.01)
*G01R 33/58* (2006.01)

(52) U.S. Cl.
CPC ......... *G01R 33/565* (2013.01); *G01R 33/341* (2013.01); *G01R 33/5659* (2013.01); *G01R 33/583* (2013.01)

(58) Field of Classification Search
CPC .............. G01R 33/565; G01R 33/5659; G01R 33/341; G01R 33/583; G01R 33/54; G01R 33/385; A61B 5/055
See application file for complete search history.

(56) References Cited

U.S. PATENT DOCUMENTS

| 5,525,906 | A  | * | 6/1996  | Crawford | G01R 33/3621 324/318 |
| 6,420,873 | B1 | * | 7/2002  | Guthrie  | G01R 33/56 324/318   |
| 2004/0164739 | A1 | * | 8/2004 | Peterson | G01R 33/28 324/322 |
| 2006/0181278 | A1 | * | 8/2006 | Nozaki   | G01R 33/3415 324/318 |
| 2008/0315879 | A1 | * | 12/2008 | Saha    | A61B 5/055 324/318 |

(Continued)

FOREIGN PATENT DOCUMENTS

| DE | 19524573 A1    | 1/1996  |
| DE | 102016223478 A1 | 5/2018 |
| WO | WO2014167561 A2 | 10/2014 |

OTHER PUBLICATIONS

European Search Report for European Patent Application No. 18160421.6-1022 dated Oct. 9, 2018.

*Primary Examiner* — G. M. A Hyder
(74) *Attorney, Agent, or Firm* — Lempia Summerfield Katz LLC

(57) ABSTRACT

A device and a method for detecting a spike during a magnetic resonance scan are provided. The device has a first receiver with a first signal connection for connecting a local coil and a second receiver with a second signal connection for connecting a reference antenna. The device is configured to compare a first signal received by the first receiver via the first signal connection with a second signal received by the second receiver via the second signal connection and, in the event of a predetermined deviation, to emit a warning signal.

19 Claims, 2 Drawing Sheets

(56) References Cited

U.S. PATENT DOCUMENTS

| | | | |
|---|---|---|---|
| 2014/0300358 A1* | 10/2014 | Rapoport | G01R 33/565 324/311 |
| 2017/0108569 A1* | 4/2017 | Harvey | G01R 33/36 |
| 2018/0149725 A1 | 5/2018 | Beck | |

* cited by examiner

DEVICE AND METHOD FOR DETECTING SPIKES DURING A MAGNETIC RESONANCE SCAN

The present patent document claims the benefit of European Patent Application No. EP 18160421.6, filed Mar. 7, 2018, which is also hereby incorporated by reference.

TECHNICAL FIELD

The disclosure relates to a method and a device for detecting an interference signal, in particular spikes, during a magnetic resonance scan. The device has a receiver with a first signal connection for connecting a local coil and a second signal connection for connecting a reference antenna.

BACKGROUND

Magnetic resonance tomographs are imaging devices which, for imaging an examination object, orient nuclear spins of the examination object with a strong external magnetic field and by an alternating magnetic field, excite them to precession about this orientation. The precession or return of the spin from this excited state into a state with lower energy generates an alternating magnetic field as a response, also designated a magnetic resonance signal, which is received via antennas.

With the help of magnetic gradient fields, a position encoding is impressed upon the signals, which subsequently enables an allocation of the received signal to a volume element. The received signal is then evaluated and a three-dimensional imaging representation of the examination object is provided. The representation created gives a spatial density distribution of the spin.

The magnetic resonance signals received are very weak, e.g., in part only just over the noise limit. At the same time, the excitation pulses have energies in the kilowatt range and for the gradient fields, currents of several hundred amperes flow.

Due to the strong fields and also indirectly due to mechanical-electrical interactions, in the region of the patient accessways, electrical potentials may form, and, on their equalization, small discharges may take place which lead to brief broad-band interference pulses, known as spikes. Hereby, during the subsequent image processing, through the Fourier transform, from individual spikes, whole patterns of artifacts distributed over the image may arise.

From German patent publication DE 10 2016 223478, a magnetic resonance tomograph is known which acquires the physiological data of the patient and thereby orients the sequences of image acquisition temporally so that the acquisition of the physiological signals is not disrupted.

SUMMARY AND DESCRIPTION

It is therefore an object of the present disclosure to improve the image quality of magnetic resonance tomograph scans.

The scope of the present disclosure is defined solely by the appended claims and is not affected to any degree by the statements within this summary. The present embodiments may obviate one or more of the drawbacks or limitations in the related art.

The device for detecting a spike during a magnetic resonance scan has a first receiver with a first signal connection for connecting a local coil and a second receiver with a second signal connection for connecting a reference antenna. The reference antenna may be any antenna for receiving signals with frequencies in the region of the Larmor frequency. The device is configured to compare a first signal received by the first receiver via the first signal connection with a second signal received by the second receiver via the second signal connection. Thereby it is, for example, the analog and amplified antenna signal or a signal converted to an intermediate frequency that may be regarded as the received signal. Also conceivable is an antenna signal digitized directly or after a filtration. The receivers may be separate receivers of the device, but for example, also receivers or receiving channels of the receiver of the magnetic resonance tomograph, which are also used for processing the magnetic resonance signals for the image acquisition. In a digital embodiment, it is also conceivable for the receivers to be configured as a time multiplex of a digital signal processing.

The comparison may be a direct comparison of the size of the amplitudes or a variable derived therefrom, for example, the energy. An averaging over a particular time period is also conceivable. It may also be a part of the comparison that the device is configured to equalize different sensitivities of the local coil by scaling one or both signals with a factor or analogously by an amplifier. The comparison may similarly be undertaken by a comparator or with digital signal processing by a calculation operation such as, for example, difference or quotient formation. The apparatus is configured to output a warning signal in the event of a predetermined deviation. The predetermined deviation may exist if the difference between the second signal and the first signal is greater than 10%, 20%, 50%, or 100% of the size of the first signal. It is also conceivable that a quotient of the second signal to the first signal is formed. It may happen that the predetermined deviation is exceeded, for example, if the quotient assumes a value of greater than 1.1, 1.3, 1.5, or 2.

It is also conceivable that more complex methods are used, for example, a pattern comparison or an autocorrelation between the first signal and the second signal. If the second signal from the reference antenna is recognized in the first signal from the local coil, the magnetic resonance signal is probably subject to interference.

The method is provided for recognizing a spike in a magnetic resonance scan with a magnetic resonance tomograph, wherein the magnetic resonance tomograph includes a local coil, a reference antenna, and a device for detecting a spike during a magnetic resonance scan with a receiver having a first signal connection in signal communication with the local coil and a second signal connection in signal communication with the reference antenna.

In an act of the method, a first signal is received by the local coil via the first signal connection of the receiver. Received should be understood herein to mean that the signal is available for further processing, whether by a digital signal processing when the signal has already been digitized, or an analog processing in the device. The signal may be resolved temporally such that at least the base frequency of a spike (e.g., equal to the inverse of the spike duration) is captured, for example, in that the scan frequency is double the base frequency or the frequency response of the receiver at least covers the base frequency.

In another act of the method, a second signal is received by the reference antenna via the second signal connection of the receiver. The statement just made above applies thereby to the receiving and the base frequency.

In another act of the method, the first signal and the second signal are compared by the device. The comparison may take place by a comparison unit, for example, with an analog comparator or digitally by difference or quotient formation or a digital comparator. It is thereby conceivable that as part of the comparison of one or both signals, initially amplification or scaling takes place, for example, in order to compensate for different sensitivities of the local coil and the reference antenna.

In a further act of the method, the device tests the result of the comparison for a predetermined deviation. For example, the result of the comparison may be evaluated with an analog or digital window discriminator. Also conceivable is the comparison with stored values in a table or logical links of predetermined inequalities using the comparison result. If a predetermined deviation is detected by the device, then it issues a warning signal.

In an advantageous manner, an evaluation and comparison of a signal from the local coil which contains the magnetic resonance signal and a signal from a reference antenna which has none or a smaller proportion of the magnetic resonance signal in comparison with the interference signal of the spike, enables a reliable detection of the occurrence of a spike even if this lies in the amplitude range of the magnetic resonance signal.

In a conceivable embodiment of the device, the device is configured to carry out the comparison in real time. For example, the device may include corresponding elements for scaling, difference formation, and evaluation of the first signal and of the second signal, even if as nested analog components or as digital signal processing resources with corresponding programming. Thereby, in one embodiment, it may also be considered to be real time if the comparison of the signals and the detection of a deviation may take place between two excitation pulses of a sequence.

In an advantageous manner, the comparison and detection in real time enables the pulse train currently disrupted by a spike to be repeated and with a minimum time expenditure, only the disrupted part of an image capture to be repeated rather than the whole image capture, and possibly the image evaluation, if the problem is first detected through artifacts in the image.

In a possible embodiment of the device, the device is configured only to carry out the comparison if the first and/or second signal fulfill a predetermined prior condition. For example, one level or the levels of both signals may be monitored and on exceeding a predetermined threshold value, the comparison may be carried out.

In an advantageous manner, the evaluation of a precondition increases the probability of a correct detection of an interference signal with simultaneous reduction of the processor load because, for example, in a digital device the comparison does not have to take place permanently and the computation resources may be used differently.

In a conceivable embodiment of the device, the predetermined deviation includes an exceeding of a predetermined limit value for an amplitude ratio of the second signal to the first signal.

The reference antenna may be positioned such that the reference antenna absorbs the interference signal relative to a background noise and/or also relative to the magnetic resonance signal with a greater amplitude than the local coil, for example, in that the reference antenna is arranged closer to a wall of the patient tunnel so that it is positioned closer to a potential discharge source and further from the source of the magnetic resonance signals.

In an advantageous manner, interference signals from spikes are distinguished by a relatively greater amplitude in the second signal relative to the first signal and may thus be identified more easily.

In a possible embodiment of the magnetic resonance tomograph, it has a local coil in signal communication with the first signal connection, a reference antenna in signal communication with the second signal connection and a control system in signal communication with the device. The control system is thereby configured, on arrival of the warning signal from the device, to repeat the last scan cycle or pulse train on the basis of first signals and second signals of which the warning signal was generated.

A disrupted magnetic resonance signal in a pulse train in the sampling of one or more k-space points has effects on the entire image due to the algorithms in the image evaluation. If, however, the interference signal has already been detected during the acquisition of one or a few points in the k-space, this individual pulse train may be repeated and so advantageously, as compared with a repetition of the entire image acquisition, a significant amount of time may be saved.

In a conceivable embodiment of the magnetic resonance tomograph, the magnetic resonance tomograph has a body coil. The body coil is thereby attached as a reference antenna to the second signal connection of the device. In other words, the magnetic resonance tomograph is configured to pass on a signal received as the second signal, by the body coil, to the device and there to compare it with the first signal and/or to carry out the other procedures described in relation to the second signal.

The body coil may have a larger spacing from the body of the patient as compared with a local coil, whilst the spacing from the wall of the patient tunnel is smaller. A discharge in the structure of the patient tunnel or frequently adjoining elements such as an HF screen or gradient coils therefore leads in an advantageous manner to a larger signal amplitude in the body coil relative to a magnetic resonance signal from the body of the patient and may therefore serve, in particular, as compared with the first signal of the local coil, to identifying an interference pulse.

In a possible embodiment, the magnetic resonance tomograph is configured to detune the body coil and to compare a second signal at a frequency not equal to the Larmor frequency of the magnetic resonance tomograph, e.g., in a neighboring frequency region with a frequency deviation of at least 1%, 5%, 10%, or more of the Larmor frequency, in the device.

Whilst magnetic resonance signals lie in a relatively narrow band in a region of the Larmor frequency, interference pulses from discharges, in particular, are relatively broad-band. When the reference antenna is detuned, (e.g., set to a resonance frequency not equal to the Larmor frequency), the magnetic resonance signal is suppressed as far as possible in the second signal, whereas the envelope curve of an interference pulse is largely unchanged at this frequency relative to an envelope curve at the Larmor frequency. A comparison of an envelope curve of the first signal at the Larmor frequency with an envelope curve of a second signal at the detuned frequency thereby advantageously further removes a possible interference signal relative to the magnetic resonance signal. However, it is also conceivable, due to the greater sensitivity of the body coil to electric fields despite the detuned body coil, to leave the receiver tuned to the Larmor frequency, wherein the magnetic resonance signals from the body of the patient are weakened due to the predominant B-field portion relative to the spike with predominantly electric field components. A receiver for imaging without modification may also be used for interference signal detection.

In a conceivable embodiment of the method, the method further includes the act of emitting a test pulse. It is also conceivable that the test pulse is an excitation pulse and is configured to excite nuclear spin in a sample or a patient. Thereby, the power may correspond to the excitation power of a pulse from an image capture sequence. The power for reducing an SAR loading may be lower, for example, by a value of a factor of 2, 5, 10, or less. It is only required that the excitation pulse at an arbitrary time point after the excitation pulse generates a magnetic resonance signal of the spin in the local coil and the reference antenna that lies above a noise level.

However, it is also conceivable that the test pulse is provided not for the excitation of nuclear spin, but directly for receiving by the local coil and/or the reference antenna. Thereby, a dedicated transmitting antenna may be provided, e.g., in a region where spikes arise. Thus, aside from the local coil, the body coil may also receive a test signal generated by the test pulse. However, it is also conceivable that the test pulse is emitted via the body coil as a transmitting antenna. Because the body coil barely changes in its geometry and properties during operation, a predetermined reference value may be adopted for the test signal of the body coil, which is obtained through calculation or prior measurement. The local coil, by contrast, may be exchanged and is measured by the test pulse and the received test signal. Advantageously, by the direct reception of the test pulse as the test signal, the power for the test pulse may be yet lower, in a region of a few watts, milliwatts or below and the SAR loading may be further reduced.

In a further act, a test signal is received via the local coil and the first signal connection of the device. Provided the test pulse was an excitation pulse and evokes a magnetic resonance signal or the test pulse was emitted via a separate transmitting antenna, in another act, the test signal is received via the reference antenna and the second signal connection of the device.

In another act, a dependency of the test signal received via the first signal connection on the test signal received via the second signal connection is determined. The determined dependency is suitable, in particular, for recognizing differences in the reception routes in order to be able to take them into account in a comparison or to balance them in advance. Provided the test pulse is emitted via the body coil and has been received directly as a test signal by the local coil, for the test signal received via the second signal connection, a predetermined value is used which, for example, has been determined by a measurement performed at an earlier time point with a separate transmitting antenna.

Thereby, the predetermined deviation which is determined and evaluated on comparison of the first signal with the second signal is a substantial deviation of a dependency of the first signal on the second signal from the previously determined dependency of the test signals. If, for example, it has been determined by the test signal that a magnetic resonance signal from the body still only has a signal amplitude in the body coil of 20% as compared with the signal of the local coil, then an interference signal which has a signal in the body coil with an amplitude of 50% or more as compared with the signal generated in the local coil may be regarded as a predetermined deviation in that it substantially deviates with a ratio of 50:100 from the other amplitude ratio of 20:100.

Because the dependency of signals received via the reference antenna and the local coil is determined or established on the basis of an excitation pulse in a calibration procedure, the method may take account of different geometries, for example, in a changed position or type of local coil, and in this way may recognize interferences more reliably and with greater sensitivity and prevent their consequences in the image representation.

In a possible embodiment of the method, the dependency determined in the calibration procedure described above is a measure of the ratio of the amplitudes of the magnetic resonance signal received via the second signal connection to the magnetic resonance signal received via the first signal connection. A substantial deviation exists if the predetermined ratio is exceeded by more than 10%, 20%, 50%, or 100%.

By the previously described calibration, it is known how or with what amplitude a test signal or a desired magnetic resonance signal from the body of the patient is received by the local coil and the reference antenna. If a signal received via the local coil and the reference antenna deviates from this amplitude ratio, then this is an indication that the signal does not come from the body of the patient and is therefore not a useful signal, but rather an interference signal. It is thereby conceivable that in the comparison, the amplitude ratio determined in the calibration procedure is the measure of the comparison or that by a scaling of the signals, according to the amplitudes determined during the calibration, normalization to a ratio of 1:1 takes place in each case.

In a conceivable embodiment of the method, the reference antenna is a body coil. Thereby, the body coil is detuned via the second signal connection in the act of the reception. For example, a control system of the magnetic resonance tomograph may bring a capacitance into signal communication with the body coil by a switch and thereby displace the resonance frequency of the body coil relative to the Larmor frequency, for example, by 2%, 5%, 10%, or more. Also conceivable are variable capacitances such as PIN diodes in which the quantity of the detuning is controllable by an applied voltage. If the reference antenna is not the body coil, then the reference antenna may be tuned from the start to a frequency unequal to the Larmor frequency.

Due to the closeness to the wall of the patient tunnel and the gradient coil, the body coil has a particular sensitivity to interference signals in this region and enables a better detection of interference signals with simultaneous reception via the body coil and the local coil. The suppression of the magnetic resonance signal by the detuning also advantageously facilitates the distinguishing from the magnetic resonance signal.

In a possible embodiment of the method, the method further includes the act of repeating the last magnetic resonance scan by the magnetic resonance tomograph if the warning signal arrives from the device. In particular, the scan sequence after the last radio-frequency excitation pulse for the nuclear spin is regarded, in particular, as the last magnetic resonance scan, so that the disrupted data may be replaced by an identical scan without disruption.

In an advantageous manner, the method makes it possible to recognize a disruption in real time, so that only the disrupted part of a scan is repeated in order to replace the disrupted data with undisrupted data and thereby to prevent errors in the image processing.

In a conceivable embodiment of the method, the method further includes the act of removing the interference signal from the last magnetic resonance scan by the magnetic resonance tomograph if the warning signal arrives from the device. For example, it is conceivable that the data which has been acquired directly during the interference itself is deleted or is replaced by a constant value. An interpolation is also conceivable. Thereby, the warning signal may have information regarding the start and the end of the interference.

It is also conceivable, however, that through the correlation of the first signal and the second signal, a portion of the interference signal is determined in the first signal and is removed from the first signal, for example, in that the interference signal is suitably scaled and subtracted by the receiver and/or the control system of the magnetic resonance tomograph.

In an advantageous manner, it enables the reception with the local coil and the reference antenna to differentiate and separate the interference signal from the magnetic resonance signal so that even without additional scanning the data is corrected, and artifacts may be reduced accordingly.

In certain embodiments, a computer program product is provided. The computer program product may be loaded directly into a processor of a control system of the magnetic resonance tomograph. The computer program product may include program code configured to carry out all the acts of a method disclosed herein when the program product is executed on the control unit.

In other embodiments, a computer readable storage medium is provided. The computer readable storage medium includes electronically readable control information stored thereon, which are configured in order, on use of the storage medium in the control unit of the magnetic resonance tomograph, to carry out the acts of the method disclosed herein.

BRIEF DESCRIPTION OF THE DRAWINGS

The above-described properties, features and advantages of this disclosure and the manner in which these are achieved will now be described more clearly and explicitly with the following description of the exemplary embodiments, and by reference to the drawings, in which.

DETAILED DESCRIPTION

Figure 1:
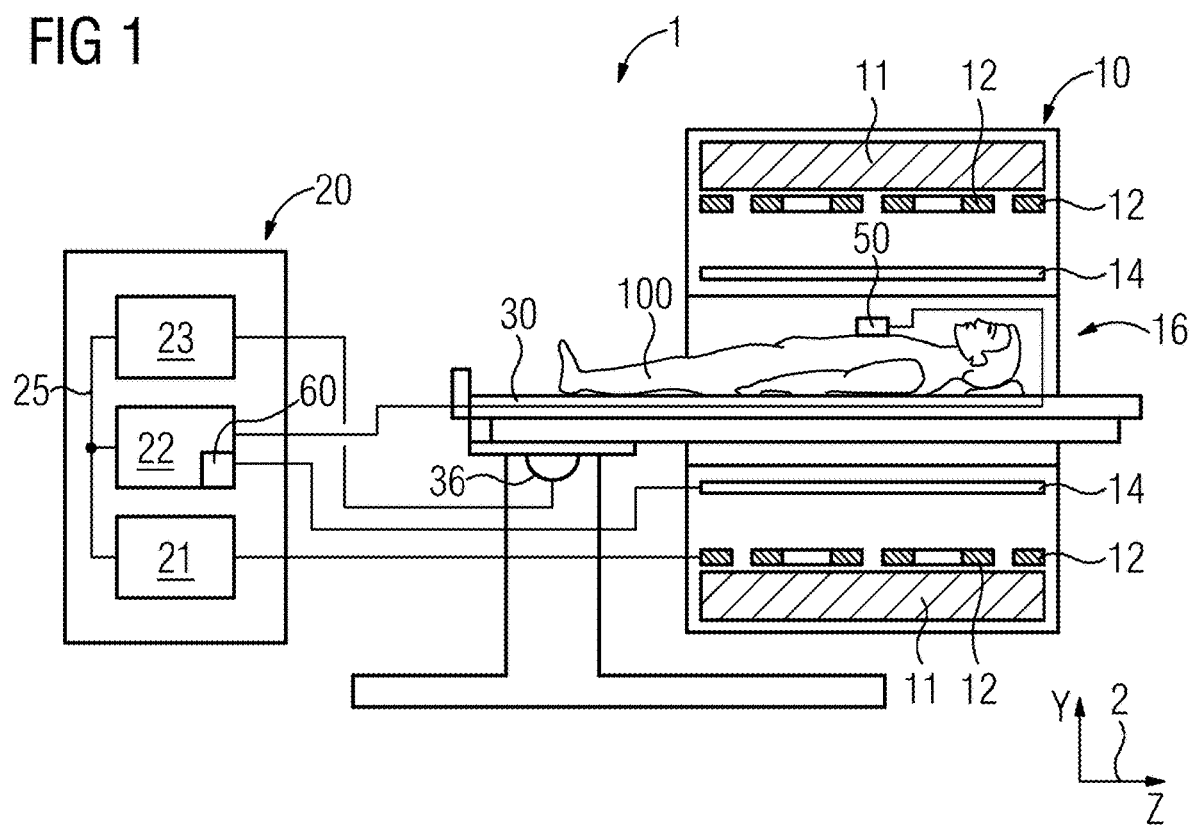
FIG. 1 depicts an exemplary schematic representation of a magnetic resonance tomograph with a radio-frequency control system.

FIG. 1 is a schematic representation of an embodiment of a magnetic resonance tomograph 1 with a device 60 for detecting spikes.

The magnet unit 10 has a field magnet 11 which generates a static magnetic field BO for aligning the nuclear spins of samples or patients 100 in a scanning region. The scanning region is arranged in a patient tunnel 16 which extends in a longitudinal direction 2 through the magnet unit 10. A patient 100 is movable by the patient table 30 and the positioning unit 36 into the scanning region. The field magnet 11 may be a superconducting magnet which may provide magnetic fields with a magnetic flux density of up to 3T and in the newest devices even higher. For weaker field strengths, however, permanent magnets or electromagnets with normally conducting coils may also be used.

The magnet unit 10 further includes gradient coils 12 which are configured, for spatial differentiation of the captured imaging regions in the examination volume, to overlay variable magnetic fields onto the magnetic field BO in three spatial directions. The gradient coils 12 may be coils made of normally conducting wires which may generate mutually orthogonal fields in the examination volume.

The magnet unit 10 also has a body coil 14 which is configured to emit a radio-frequency signal fed via a signal line 33 into the examination volume and to receive resonance signals emitted from the patient 100 and to pass them on via a signal line. However, the body coil 14 may be replaced, for the emission of the radio-frequency signal and/or the reception, by local coils 50 which are arranged in the patient tunnel 16 close to the patient 100. It is also conceivable, however, that the local coil 50 is configured for transmitting and receiving and therefore a body coil 14 may be omitted.

A control unit 20 supplies the magnet unit 10 with the different signals for the gradient coils 12 and the body coil 14 and evaluates the received signals. A magnetic resonance tomograph control system 23 thereby coordinates the subsidiary units.

Thus, the control unit 20 includes a gradient controller 21 configured to supply the gradient coils 12 via feed lines with variable currents which provide the desired gradient fields in the examination volume in a temporally coordinated manner.

Furthermore, the control unit 20 includes a radio-frequency unit 22 configured to generate a radio-frequency pulse with a predetermined temporal sequence, amplitude, and spectral power distribution for excitation of a magnetic resonance of the nuclear spin in the patient 100. Thereby, pulse power levels in the region of kilowatts may be achieved. The individual units are connected to one another via a signal bus 25.

The radio-frequency signal generated by the radio-frequency unit 22 is fed via a signal communication of the body coil 14 and is emitted into the body of the patient 100 in order to excite the nuclear spin there. Also conceivable, however is an emission of the radio-frequency signal via one or more local coils 50.

The local coil 50 may receive a magnetic resonance signal from the body of the patient 100 because, due to the small distance, the signal-to-noise ratio (SNR) of the local coil 50 is better than with a reception by the body coil 14. The MR signal received by the local coil 50 is preprocessed in the local coil 50 and passed on to the radio-frequency unit 22 of the magnetic resonance tomograph 1 for evaluation and image acquisition. The signal communication 33 may be used for this, although a wireless transfer is, for example, also conceivable.

The device 60 for detecting spikes is described below in greater detail making reference to FIG. 2.

Figure 2:
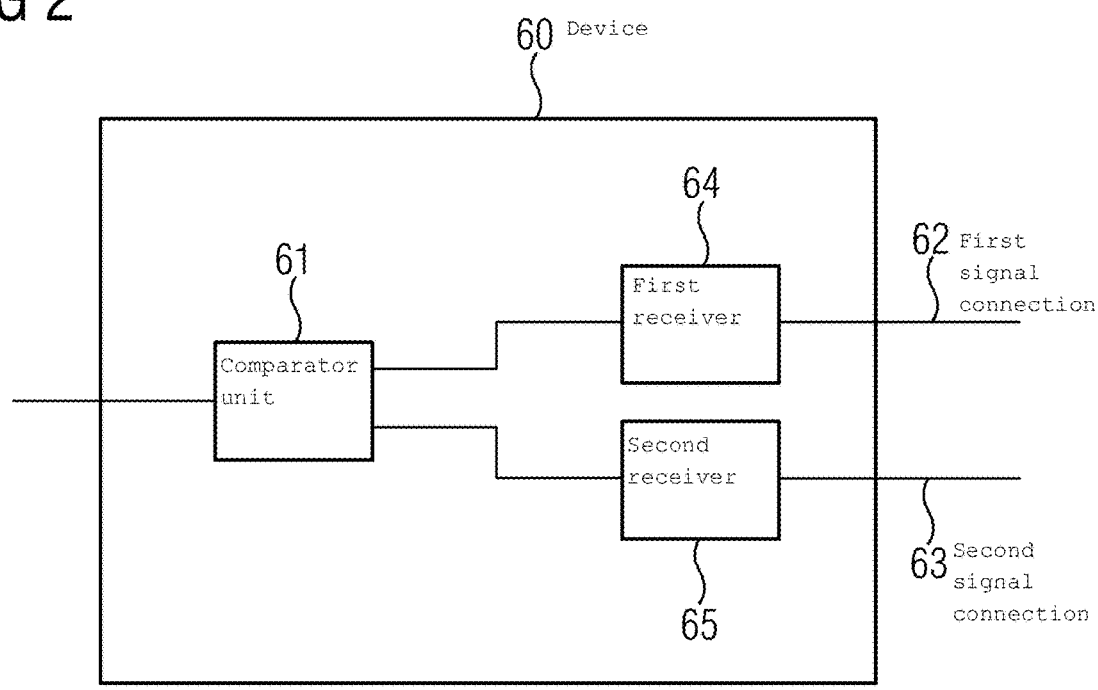
FIG. 2 depicts a schematic representation of an exemplary device for detecting spikes.

The device 60 depicted in FIG. 2 has a first signal connection 62 in signal communication with the local coil 50 and receives a magnetic resonance signal received by a local coil 50. The magnetic resonance signal may thereby be analog or digital. Furthermore, the device 60 has a second signal connection 63 which is in signal communication with a reference antenna, e.g., the body coil 14. However, another antenna device which is configured to receive signals in a region of the wall of the patient tunnel 16 with a higher sensitivity than signals from the patient 100 may also serve as the reference antenna. This may be realized, for example, by an array of reference antennas in the patient tunnel 16. The signal from the reference antenna, like the signal from the local coil 50, may be analog or digital and may be preprocessed by a signal processing unit, for example, converted into a different frequency region or filtered.

The antenna signals at the first signal connection 62 and at the second signal connection 63 are preprocessed by a first receiver 64 and a second receiver 65. If the antenna signals are, for example, analog, then the receiver 64, 65 may include an amplifier stage and a filter stage in order to amplify the signals and to free them from interference signals beyond the frequency of the magnetic resonance signal. It is also conceivable that the signals are converted to an intermediate frequency and/or are demodulated and/or digitized. If the antenna signals have already been digitized, then a digital signal processing with corresponding filters and/or functions may take place. In principle, the receivers 64, 65 may be provided exclusively for the device 60. Receivers or receiving channels of the radio-frequency unit 22 may be used which are also utilized for the image acquisition. In particular for the signals of the local coil 50, the same signals of the first receiver 64 may be used in signal communication with the local coil 50 both for detecting a spike as well as for image acquisition.

Furthermore, the device 60 includes a comparator unit 61 configured to place the signals arriving via the first signal connection 62 and the signals arriving via the second signal connection 63 in relation to one another.

The device 60 may be configured to carry out the comparison in real time. This may take place by an analog comparator circuit or a digital signal processing unit.

In particular, a digital signal processing unit is able to evaluate the signals according to a complex criterion, for example, whether they correspond in a particular pattern, such as rise speed, shape, duration, frequency distribution or the like, to a spike. A digital signal processing unit may have stored such patterns, but also an analog high-pass or band-pass filter is able to distinguish a rise speed or a frequency distribution.

On the basis of the evaluation according to different criteria, the device 60 may also be configured only to carry out a comparison if the first and/or second signal fulfill a predetermined prior condition. For example, discriminators in the comparator unit 61 allow through only signals for the actual comparison which exceed a particular minimum amplitude, in order to prevent false activations through noise. However, the discriminators may additionally or alternatively have a filter function in order to allow through only predetermined specific frequency distributions.

A comparison criterion for the comparator unit 61 may be at least an amplitude ratio that is to be achieved of a second signal at the second signal connection 63 from the reference antenna and/or the body coil 14 to a first signal at the first signal connection 62 of the local coil 50, for detecting a spike, because for a spike in the proximity of the body coil 14, a significantly stronger signal is to be expected via the second signal connection 63 to the body coil 14 than from a further removed local coil 50 at the first signal connection 62.

Figure 3:
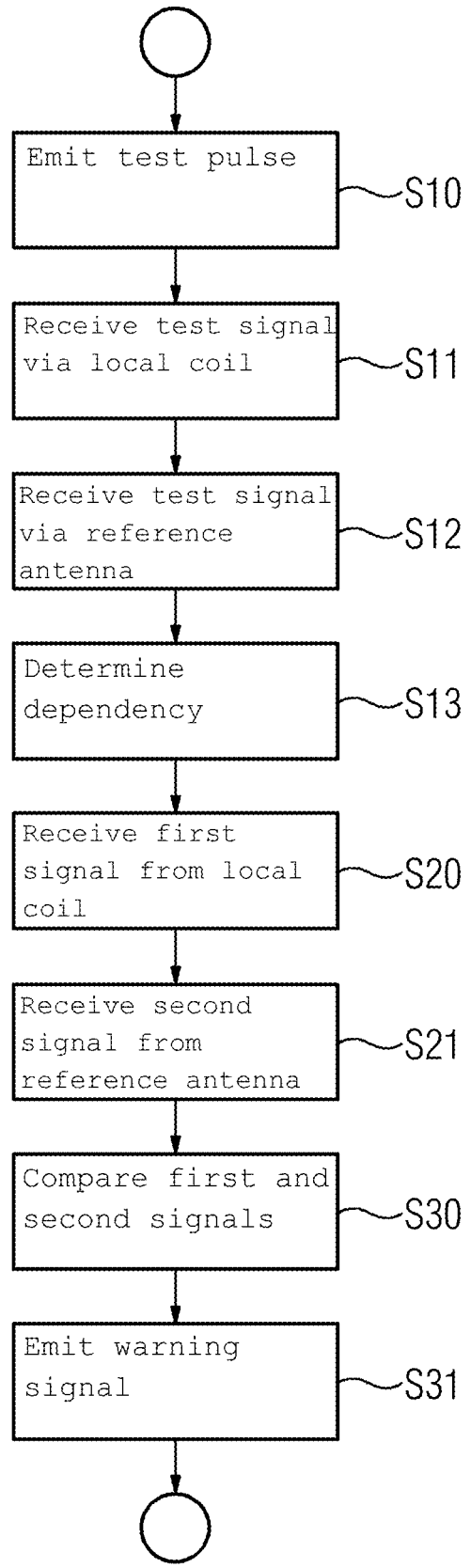
FIG. 3 depicts a schematic flow diagram of an exemplary method for detecting spikes.

FIG. 3 depicts a schematic flow diagram for a possible embodiment of a method for detecting a spike during a magnetic resonance scan with a magnetic resonance tomograph 1.

In act S20, a first signal is received from the local coil 50 via the first signal connection 62 of the device by the first receiver 64. The reception may thereby, for example, also include filtration, conversion into an intermediate frequency or a digitization.

In act S21, a second signal is received from the reference antenna via the second signal connection 63 of the device. The reference antenna may thereby also be the body coil 14. The acts S20 and S21 may be carried out simultaneously and also in real time. Thereby, what was stated regarding S20 relating to reception also applies in act S21.

In act S30, the first signal and the second signal are compared by the device, e.g., the comparator unit 61. The comparison may thereby include, for example, the formation of a difference and/or quotient from the first signal and the second signal, but other logical or arithmetic functions are also conceivable.

In act S31, a warning signal is emitted by the device to the magnetic resonance tomograph if during the comparison a predetermined deviation is detected. Values obtained during the comparison may be compared, for example, with a predetermined threshold value and on exceeding it, the warning signal is emitted. For example, during comparison, a quotient or a difference from the output signal of the second receiver in signal communication with the reference antenna and of the first receiver in connection with the local coil 50 may be formed. If the quotient for magnetic resonance signals has, for example, the value 0.5 due to the geometry and different sensitivities for magnetic resonance signals from the body, a threshold value of 0.7 may be provided. If the quotient then assumes the value 0.8 or greater because a spike in the body coil 14 as the reference antenna generates a stronger signal than in the local coil 50, then the predetermined threshold value is exceeded, and a deviation is detected.

In a possible embodiment of the method, it is thereby conceivable that a calibration of the device 60 also takes place in order to compensate for different sensitivities, in particular in the use of different local coils 50.

For this purpose, in act S10, a test pulse is emitted. In this regard, there are two different embodiments of the method.

In one embodiment, the test pulse is an excitation pulse for nuclear spin of a sample and/or the patient 100 in the patient tunnel 16. The nuclear spins in turn generate a magnetic resonance signal received in act S11 via the local coil 50 and the first signal connection 62, and in act S12 is received via the reference antenna and the second signal connection 63 in order to determine an amplitude ratio and/or a relative sensitivity of the local coil 50 in relation to the reference antenna. Because the excitation and the reception of the magnetic resonance signal as a test signal takes place temporally offset, for example, the body coil 14 itself may serve as a transmitting antenna for the test pulse and also as a reference antenna for the test signal in the form of the magnetic resonance signal. Here also, the different and changeable spacing of the patient 100 from the local coil 50 and the body coil 14 is taken into account directly, as it is subsequently also available in the magnetic resonance signals for the imaging. However, for excitation of the nuclear spin, substantially higher power levels are required, such that the test pulse more strongly loads the SAR budget, even if due to the lower signal-to-noise ratio required, it may turn out to be weaker than for the imaging, for example, with a power level of less than 1000 W, 500 W, 200 W, or 100 W.

In another embodiment, the test pulse is received directly and simultaneously as a test signal. For this purpose, it is either conceivable that the test pulse is emitted by a separate transmitting antenna so that the local coil 50 in act S11 via the first signal connection 62 and/or the reference antenna in act S12 via the second signal connection 63, in particular the body coil 14 as the reference antenna, may directly and simultaneously receive this test pulse as the test signal. In a subsequent determination of the dependency, the position of the transmitting antenna is then to be taken into account. If the transmitting antenna is in the vicinity of the site of origin of spikes close to the wall of the patient tunnel and to the gradient coil, then the received signal intensities of the test signal more likely correspond to the ratio of the signal strengths for a spike, whereas in an arrangement closer to the position of the patient 100, they are more likely to correspond to the ratio of the signal strengths for the magnetic resonance signal. In the latter case, it is conceivable that the local coil 50 has a transmitting antenna.

It is also conceivable that the test pulse is emitted via a body coil 14, wherein a simultaneous reception via the body coil 14 is then not possible. It is therefore required for the test signal of the body coil 14 as the reference antenna to use a predetermined value, for example, received during a prior scan in act S12 via the reference antenna and the second signal connection 63, or obtained by calculation.

In both cases, the power of the test pulse may advantageously be reduced to less than 0.01 Watt, 0.1 Watt, 1 Watt, or 10 Watt, so that the test pulse is not to be taken into account in the SAR budget.

In act S13, a dependency of the test signal received via the first signal connection on the test signal received via the second signal connection is determined. It may, for example, be a ratio or a difference of the amplitudes or power of the test signals, absolutely or averaged over the signals. If the calibration takes place by a test pulse with a source in the vicinity of the reference antenna, then a dependency may also be formed, for example, by an inverse value of the ratio or by a threshold value which corresponds to a mean value of the two signals.

The deviation predetermined in act S31 may be a substantial deviation of a dependency of the first signal on the second signal from the dependency determined in act S13. The dependency may be related to a magnetic resonance signal so that, for example, a signal the amplitude ratio of which deviates therefrom in that the received signal for the body coil 14 with reference to, or weighting with, the determined dependency is greater than the signal received by the local coil 50, is detected as a spike.

In one embodiment, the dependency may be a measure for the ratio of the amplitudes of the test signal received via the second signal connection 63 to the test signal received via the first signal connection 62. A substantial deviation exists, for example, if the predetermined ratio is exceeded by more than 10%, 20%, 50%, or 100%.

In an embodiment in which a body coil 14 is the reference antenna, in the act S21 and/or S12 of reception, it may be provided via the second signal connection thereby, (e.g., during the reception of the signal or the test signal), to detune the body coil 14. An interference signal or spike may have a frequency spectrum that is broader than a magnetic resonance signal. Because, in order to receive an interference signal and/or during the calibration in act S12, the body coil 14 is detuned relative to the Larmor frequency by more than 10 kHz, 100 kHz, or 1 MHz, the interference signal may be emphasized relative to a magnetic resonance signal and more easily recognized. This applies also if the second receiver 65 itself remains tuned to the Larmor frequency, because the body coil 14 has an increased sensitivity to electric fields which predominate in the close range during a spike and emphasize the spike relative to the B1 fields of the MR signals emerging from the body of the patient 100 from the body coil 14.

In act S40 of an embodiment of the method, the last magnetic resonance scan by the magnetic resonance tomograph 1 is repeated if the warning signal arrives from the device 60. For example, the device 60 is in signal communication via a signal communication with the control unit 20 of the magnetic resonance tomograph 1, by which the warning signal may be transmitted. If the control unit 20 receives this warning signal, then the control unit may repeat the last pulse train, (e.g., the sequence of the image acquisition following the last excitation pulse), in order to obtain interference-free scan data for image reconstruction without artifacts from spikes.

In another possible embodiment, the control unit 20 is configured to remove the interference signal from the last magnetic resonance scan if the warning signal arrives from the device 60. For example, it is conceivable that the control unit 20 simulates scan data by interpolation for the duration of the interference. It is also conceivable that the interference signal is extracted from the magnetic resonance signal of the reference antenna and is substantially removed from the scan data, for example, by scaling and subtraction or more complex methods.

Although the disclosure has been illustrated and described in detail by the exemplary embodiments, the disclosure is not restricted by the disclosed examples and the person skilled in the art may derive other variations from this without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A device for detecting a spike during a magnetic resonance scan, the device comprising:
   a first receiver having a first signal connection for connecting a local coil;
   a second receiver having a second signal connection for connecting a reference antenna; and
   a comparator unit configured to compare a first signal received by the first receiver via the first signal connection with a second signal received by the second receiver via the second signal connection,
   wherein the device is configured to output a warning signal in an event of a predetermined deviation in the comparison between the first signal and the second signal.

2. The device of claim 1, wherein the comparison is configured to be carried out in real time.

3. The device of claim 2, wherein the comparison comprises a pattern comparison between the first signal and the second signal.

4. The device of claim 1, wherein the comparison comprises a pattern comparison between the first signal and the second signal.

5. The device of claim 4, wherein the device is configured to only carry out the comparison when the first signal, the second signal, or both the first signal and the second signal fulfill a predetermined prior condition.

6. The device of claim 4, wherein the predetermined deviation comprises an exceeding of a predetermined limit value for an amplitude ratio of the second signal to the first signal.

7. The device of claim 1, wherein the device is configured to only carry out the comparison when the first signal, the second signal, or both the first signal and the second signal fulfill a predetermined prior condition.

8. The device of claim 1, wherein the predetermined deviation comprises an exceeding of a predetermined limit value for an amplitude ratio of the second signal to the first signal.

9. A magnetic resonance tomograph comprising:
a device for detecting a spike during a magnetic resonance scan, the device comprising:
  a first receiver having a first signal connection for connecting a local coil; and
  a second receiver having a second signal connection for connecting a reference antenna,
  wherein the device is configured to compare a first signal received by the first receiver via the first signal connection with a second signal received by the second receiver via the second signal connection, and
  wherein the device is configured to output a warning signal in an event of a predetermined deviation in the comparison between the first signal and the second signal;
a local coil in signal communication with the first signal connection;
a reference antenna in signal communication with the second signal connection; and
a control unit in signal communication with the device, wherein the control unit is configured, on arrival of the warning signal from the device, to repeat a last scan cycle based on the first signal and second signal of which the warning signal was generated.

10. The magnetic resonance tomograph of claim 9, further comprising:
  a body coil connected as a reference antenna to the device.

11. A method for recognizing a spike in a magnetic resonance scan with a magnetic resonance tomograph, wherein the magnetic resonance tomograph comprises a local coil, a reference antenna, and a device for detecting a spike during a magnetic resonance scan with a first receiver having a first signal connection in signal communication with the local coil and a second signal connection in signal communication with the reference antenna, the method comprising:
receiving a first signal from the local coil via the first signal connection of the first receiver;
receiving a second signal from the reference antenna via the second signal connection of a second receiver;
comparing the first signal and the second signal by the device; and
emitting a warning signal, by the device, to the magnetic resonance tomograph when a predetermined deviation is detected in the comparing.

12. The method of claim 11, further comprising:
emitting a test pulse;
receiving a test signal via the local coil and the first signal connection of the device;
receiving the test signal via the reference antenna and the second signal connection of the device; and
determining a dependency of the test signal received via the first signal connection on the test signal received via the second signal connection,
wherein the predetermined deviation is a substantial deviation of a dependency of the first signal on the second signal from the determined dependency of the test signal.

13. The method of claim 12, wherein the determined dependency is a measure for a ratio of amplitudes of the test signal received via the second signal connection to the test signal received via the first signal connection, and
  wherein the substantial deviation has taken place when the ratio is exceeded by more than 10%.

14. The method of claim 13, wherein the reference antenna is a body coil, and
  wherein the receiving of the test signal via the second signal connection comprises detuning the body coil.

15. The method of claim 14, further comprising:
repeating a last magnetic resonance scan by the magnetic resonance tomograph when the warning signal arrives from the device.

16. The method of claim 14, further comprising:
removing an interference signal from a last magnetic resonance scan by the magnetic resonance tomograph when the warning signal arrives from the device.

17. The method of claim 12, wherein the reference antenna is a body coil, and
  wherein the receiving of the test signal via the second signal connection comprises detuning the body coil.

18. The method of claim 11, further comprising:
repeating a last magnetic resonance scan by the magnetic resonance tomograph when the warning signal arrives from the device.

19. The method of claim 11, further comprising:
removing an interference signal from a last magnetic resonance scan by the magnetic resonance tomograph when the warning signal arrives from the device.

* * * * *